United States Patent
White, II et al.

(10) Patent No.: US 9,929,601 B2
(45) Date of Patent: Mar. 27, 2018

(54) APPARATUS AND METHOD FOR LOST POWER DETECTION

(71) Applicant: QUALCOMM Incorporated, San Diego, CA (US)

(72) Inventors: Mark D. White, II, San Diego, CA (US); Edward Kenneth Kallal, San Diego, CA (US); Ryan Tseng, Coronado, CA (US)

(73) Assignee: QUALCOMM Incorporated, San Diego, CA (US)

( * ) Notice: Subject to any disclaimer, the term of this patent is extended or adjusted under 35 U.S.C. 154(b) by 93 days.

(21) Appl. No.: 14/335,732

(22) Filed: Jul. 18, 2014

(65) Prior Publication Data

US 2015/0054454 A1    Feb. 26, 2015

Related U.S. Application Data

(60) Provisional application No. 61/883,920, filed on Sep. 27, 2013, provisional application No. 61/869,488, filed on Aug. 23, 2013.

(51) Int. Cl.
*H02J 50/12* (2016.01)
*H02J 50/80* (2016.01)
(Continued)

(52) U.S. Cl.
CPC .............. *H02J 50/12* (2016.02); *G01R 21/01* (2013.01); *G01R 29/0814* (2013.01); *G01V 3/12* (2013.01);
(Continued)

(58) Field of Classification Search
CPC .................................................... H02J 5/005
(Continued)

(56) References Cited

U.S. PATENT DOCUMENTS

| 8,766,487 B2 * | 7/2014 | Dibben | H02J 5/005 307/104 |
| 8,957,549 B2 * | 2/2015 | Kesler | H03H 7/40 307/104 |

(Continued)

FOREIGN PATENT DOCUMENTS

| CN | 102823101 A | 12/2012 |
| CN | 103176217 A | 6/2013 |

(Continued)

OTHER PUBLICATIONS

International Search Report and Written Opinion—PCT/US2014/050077—ISA/EPO—Nov. 10, 2014.

(Continued)

*Primary Examiner* — Drew A Dunn
*Assistant Examiner* — Jerry D Robbins
(74) *Attorney, Agent, or Firm* — Knobbe, Martens, Olson & Bear, LLP

(57) ABSTRACT

An apparatus and method for lost power detection are described. In one implementation, an apparatus for wirelessly transferring power comprises a wireless power transmitter configured to wirelessly transmit power at a first power level sufficient to power or charge a chargeable device. The apparatus further comprises a controller configured to obtain a first power measurement of the first power level. The controller is further configured to determine a first adjusted power measurement of the first power measurement based on one or more tolerance values of the wireless power transmitter. The controller is further configured to determine a second adjusted power measurement of a second power measurement of a second power level received by the chargeable device based on one or more tolerance values of the chargeable device. The controller is further configured to determine if a power difference (Continued)

between the first and second adjusted power measurements exceeds a threshold value.

20 Claims, 7 Drawing Sheets

(51) Int. Cl.
- *H02J 50/40* (2016.01)
- *H02J 5/00* (2016.01)
- *G01R 29/08* (2006.01)
- *H02J 7/02* (2016.01)
- *G01R 21/01* (2006.01)
- *G01V 3/12* (2006.01)
- *H04B 5/00* (2006.01)
- *H02J 7/00* (2006.01)

(52) U.S. Cl.
CPC ............ *H02J 5/005* (2013.01); *H02J 7/007* (2013.01); *H02J 7/025* (2013.01); *H02J 50/40* (2016.02); *H02J 50/80* (2016.02); *H04B 5/0037* (2013.01); *H04B 5/0075* (2013.01); *H02J 7/0052* (2013.01)

(58) Field of Classification Search
USPC ......................................................... 320/108
See application file for complete search history.

(56) References Cited

U.S. PATENT DOCUMENTS

| | | | |
|---|---|---|---|
| 9,148,201 B2 * | 9/2015 | Kallal | H02J 5/005 |
| 9,331,526 B2 * | 5/2016 | Stevens | H02J 50/10 |
| 2007/0228833 A1 | 10/2007 | Stevens et al. | |
| 2008/0197712 A1 * | 8/2008 | Jin | H02J 5/005 |
| | | | 307/104 |
| 2009/0127936 A1 * | 5/2009 | Kamijo | H02J 7/025 |
| | | | 307/104 |
| 2010/0070219 A1 | 3/2010 | Azancot et al. | |
| 2010/0084918 A1 | 4/2010 | Fells et al. | |
| 2010/0085918 A1 | 4/2010 | Dantuluri et al. | |
| 2011/0196544 A1 | 8/2011 | Baarman et al. | |
| 2011/0221388 A1 | 9/2011 | Low et al. | |
| 2011/0248727 A1 | 10/2011 | Krumme et al. | |
| 2011/0285214 A1 | 11/2011 | Stevens et al. | |
| 2012/0068536 A1 | 3/2012 | Stevens et al. | |
| 2012/0089039 A1 * | 4/2012 | Felix | A61B 5/0404 |
| | | | 600/523 |
| 2012/0146576 A1 * | 6/2012 | Partovi | H01F 7/0252 |
| | | | 320/108 |
| 2012/0212071 A1 | 8/2012 | Miyabayashi et al. | |
| 2012/0293007 A1 * | 11/2012 | Byun | H02J 17/00 |
| | | | 307/104 |
| 2012/0313579 A1 * | 12/2012 | Matsumoto | H02J 7/025 |
| | | | 320/108 |
| 2012/0326521 A1 | 12/2012 | Bauer et al. | |
| 2013/0002038 A1 | 1/2013 | Lee et al. | |
| 2013/0038402 A1 | 2/2013 | Karalis et al. | |
| 2013/0076153 A1 | 3/2013 | Murayama et al. | |
| 2013/0094598 A1 | 4/2013 | Bastami | |
| 2013/0162220 A1 | 6/2013 | Iijima et al. | |
| 2013/0200919 A1 * | 8/2013 | Fokkelman | G01R 31/26 |
| | | | 324/762.01 |
| 2013/0257165 A1 | 10/2013 | Singh | |
| 2013/0257168 A1 | 10/2013 | Singh | |
| 2013/0285618 A1 | 10/2013 | Iijima et al. | |
| 2014/0077617 A1 | 3/2014 | Nakano et al. | |
| 2014/0111019 A1 * | 4/2014 | Roy | G01V 3/081 |
| | | | 307/104 |
| 2015/0054352 A1 | 2/2015 | Kallal et al. | |
| 2015/0054453 A1 | 2/2015 | White, II et al. | |
| 2016/0036265 A1 | 2/2016 | Kim et al. | |

FOREIGN PATENT DOCUMENTS

| | | |
|---|---|---|
| CN | 103210562 A | 7/2013 |
| JP | 2012244732 A | 12/2012 |
| WO | WO-2012127335 A1 | 9/2012 |
| WO | WO-2013088238 A2 | 6/2013 |

OTHER PUBLICATIONS

Kuyvenhoven, N., et al., "Development of a Foreign Object Detection and Analysis Method for Wireless Power Systems," 2011 IEEE Symposium on Product Compliance Engineering (PSES), pp. 1-6.

* cited by examiner

APPARATUS AND METHOD FOR LOST POWER DETECTION

CROSS-REFERENCE TO RELATED APPLICATIONS

This application claims priority to U.S. Provisional Patent Application No. 61/883,920, entitled "APPARATUS AND METHOD FOR LOST POWER DETECTION," and filed Sep. 27, 2013, the entirety of which is incorporated herein by reference. This application also claims priority to U.S. Provisional Patent Application No. 61/869,488, entitled "SYSTEMS, APPARATUS, AND METHODS FOR QUANTIFYING POWER LOSSES DUE TO INDUCTION HEATING IN WIRELESS POWER RECEIVERS," and filed Aug. 23, 2013, the entirety of which is incorporated herein by reference.

TECHNICAL FIELD

The described technology generally relates to wireless power. More specifically, the disclosure is directed to devices, systems, and methods related to detection of non-compliant objects present in a magnetic field.

BACKGROUND

Loosely coupled wireless power systems include a power transfer unit (e.g., a charging device) and one or more power receive units (e.g., a cellphone, a laptop, etc.) to be charged. When non-compliant objects are present within, near, or around the charging region of the power transfer unit, electrical energy may be lost in the wireless power system. The lost electrical energy may harm a user, damage a device or object, start a fire, etc. As such, it is desirable to detect when the power system experiences a loss in power and to respond appropriately.

SUMMARY

An apparatus for wirelessly transferring power is provided. The apparatus comprises a wireless power transmitter configured to wirelessly transmit power at a first power level sufficient to power or charge a chargeable device positioned within a charging region. The apparatus further comprises a controller circuit operationally coupled to the wireless power transmitter and configured to obtain a first power measurement of the first power level of the wireless power transmitter. The controller circuit is further configured to determine a first adjusted power measurement of the first power measurement based on a tolerance value of at least one component of the wireless power transmitter. The controller circuit is further configured to obtain a second power measurement of a second power level received by the chargeable device. The controller circuit is further configured to determine a second adjusted power measurement of the second power measurement based on a tolerance value of at least one component of the chargeable device. The controller circuit is further configured to determine if a power difference between the first and second adjusted power measurements exceeds a threshold value.

A method for wirelessly transferring power is provided. The method comprises wirelessly transmitting power at a first power level sufficient to power or charge a chargeable device positioned within a charging region. The method further comprises obtaining a first power measurement of the first power level of the wireless power transmitter. The method further comprises determining a first adjusted power measurement of the first power measurement based on a tolerance value of at least one component of the wireless power transmitter. The method further comprises obtaining a second power measurement of a second power level received by the chargeable device. The method further comprises determining a second adjusted power measurement of the second power measurement based on a tolerance value of at least one component of the chargeable device. The method further comprises determining if a power difference between the first and second adjusted power measurements exceeds a threshold value.

An apparatus for wirelessly transferring power is provided. The apparatus comprises means for wirelessly transmitting power at a first power level sufficient to power or charge a chargeable device positioned within a charging region. The apparatus further comprises means for obtaining a first power measurement of the first power level of the wireless power transmitter. The apparatus further comprises means for determining a first adjusted power measurement of the first power measurement based on a tolerance value of at least one component of the wireless power transmitter. The apparatus further comprises means for obtaining a second power measurement of a second power level received by the chargeable device. The apparatus further comprises means for determining a second adjusted power measurement of the second power measurement based on a tolerance value of at least one component of the chargeable device. The apparatus further comprises means for determining if a power difference between the first and second adjusted power measurements exceeds a threshold value.

A non-transitory computer-readable medium is provided. The medium comprises code that, when executed, causes an apparatus to wirelessly transmit power at a first power level sufficient to power or charge a chargeable device positioned within a charging region. The medium further comprises code that, when executed, causes an apparatus to obtain a first power measurement of the first power level of the wireless power transmitter. The medium further comprises code that, when executed, causes an apparatus to determine a first adjusted power measurement of the first power measurement based on a tolerance value of at least one component of the wireless power transmitter. The medium further comprises code that, when executed, causes an apparatus to obtain a second power measurement of a second power level received by the chargeable device. The medium further comprises code that, when executed, causes an apparatus to determine a second adjusted power measurement of the second power measurement based on a tolerance value of at least one component of the chargeable device. The medium further comprises code that, when executed, causes an apparatus to determine if a power difference between the first and second adjusted power measurements exceeds a threshold value.

Figure 1:
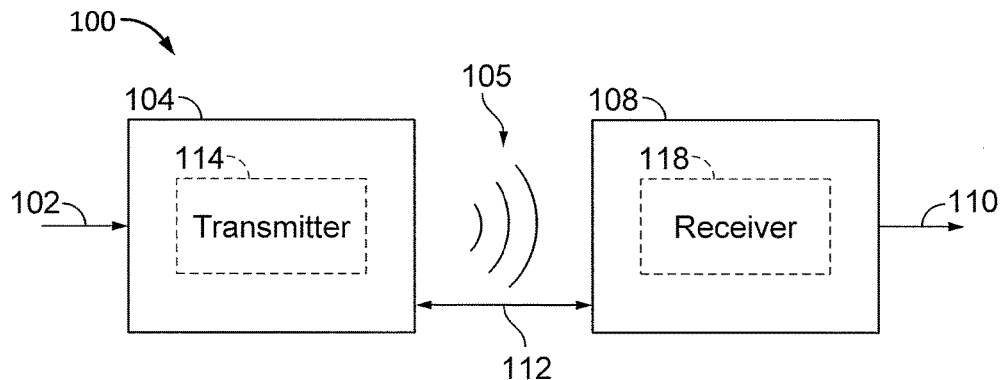
FIG. 1 is a functional block diagram of an exemplary wireless power transfer system, in accordance with exemplary embodiments of the invention.

The various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The detailed description set forth below in connection with the appended drawings is intended as a description of certain implementations of the invention and is not intended to represent the only implementations in which the invention may be practiced. The term "exemplary" used throughout this description means "serving as an example, instance, or illustration," and should not necessarily be construed as preferred or advantageous over other exemplary implementations. The detailed description includes specific details for the purpose of providing a thorough understanding of the disclosed implementations. In some instances, some devices are shown in block diagram form.

Wirelessly transferring power may refer to transferring any form of energy associated with electric fields, magnetic fields, electromagnetic fields, or otherwise from a transmitter to a receiver without the use of physical electrical conductors (e.g., power may be transferred through free space). The power output into a wireless field (e.g., a magnetic field) may be received, captured by, or coupled by a "receiving antenna" (or "receive antenna") to achieve power transfer.

FIG. 1 is a functional block diagram of an exemplary wireless power transfer system 100, which may be a loosely coupled wireless power system, in accordance with exemplary embodiments of the invention. Input power 102 may be provided to a transmitter 104 from a power source (not shown) for generating a field 105 for providing energy transfer. A receiver 108 may couple to the field 105 and generate output power 110 for storing or consumption by a device (not shown) coupled to the output power 110. Both the transmitter 104 and the receiver 108 are separated by a distance 112. In one exemplary embodiment, transmitter 104 and receiver 108 are configured according to a mutual resonant relationship. When the resonant frequency of receiver 108 and the resonant frequency of transmitter 104 are substantially the same or similar, transmission losses between the transmitter 104 and the receiver 108 are minimal. As such, wireless power transfer may be provided over larger distance in contrast to purely inductive solutions that may require large coils that require coils to be very close (e.g., mms). Resonant inductive coupling techniques may thus allow for improved efficiency and power transfer over various distances and with a variety of inductive coil configurations.

The receiver 108 may receive power when the receiver 108 is located in an energy field 105 produced by the transmitter 104. The field 105 corresponds to a region where energy output by the transmitter 104 may be captured by a receiver 108. In some cases, the field 105 may correspond to the "near-field" of the transmitter 104 as will be further described below. The transmitter 104 may include a transmit antenna 114 for outputting an energy transmission. The receiver 108 further includes a receive antenna 118 for receiving or capturing energy from the energy transmission. The near-field may correspond to a region in which there are strong reactive fields resulting from the currents and charges in the transmit antenna 114 that minimally radiate power away from the transmit antenna 114. In some cases the near-field may correspond to a region that is within about one wavelength (or a fraction thereof) of the transmit antenna 114. The transmit and receive antennas 114 and 118 are sized according to applications and devices to be associated therewith. As described above, efficient energy transfer may occur by coupling a large portion of the energy in a field 105 of the transmit antenna 114 to a receive antenna 118 rather than propagating most of the energy in an electromagnetic wave to the far field. When positioned within the field 105, a "coupling mode" may be developed between the transmit antenna 114 and the receive antenna 118. The area around the transmit and receive antennas 114 and 118 where this coupling may occur is referred to herein as a coupling-mode region. In one embodiment, the transmit antenna 114 and the receive antenna 118 may communicate via a Bluetooth Low Energy (BLE) link.

Figure 2:
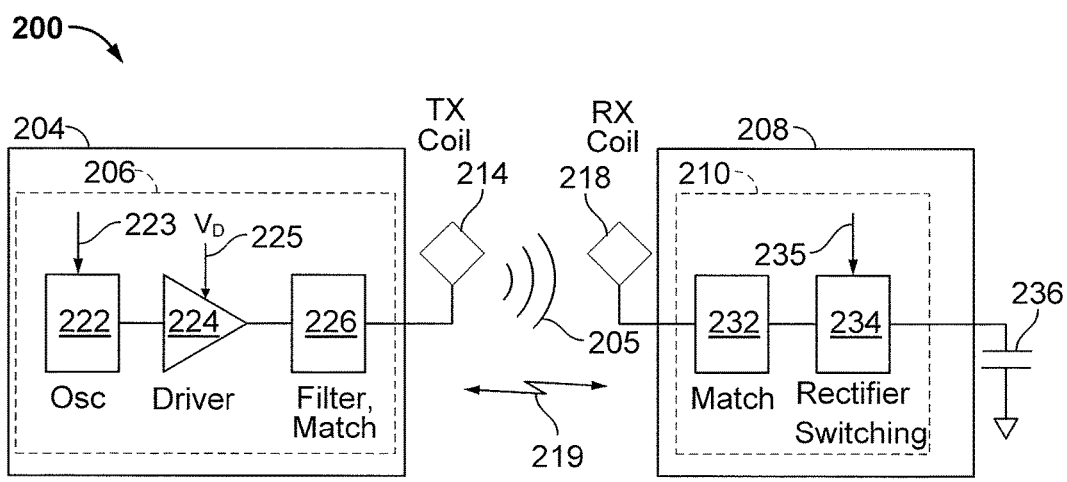
FIG. 2 is a functional block diagram of exemplary components that may be used in the wireless power transfer system of FIG. 1, in accordance with various exemplary embodiments of the invention.

FIG. 2 is a functional block diagram of exemplary components that may be used in the wireless power transfer system 100 of FIG. 1, in accordance with various exemplary embodiments of the invention. The transmitter 204 may include transmit circuitry 206 that may include an oscillator 222, a driver circuit 224, and a filter and matching circuit 226. The oscillator 222 may be configured to generate a signal at a desired frequency, such as 85 KHz, 6.78 MHz or 13.56 MHz, that may be adjusted in response to a frequency control signal 223. The oscillator signal may be provided to a driver circuit 224 configured to drive the transmit antenna 214 at, for example, a resonant frequency of the transmit antenna 214. The driver circuit 224 may be a switching amplifier configured to receive a square wave from the oscillator 222 and output a sine wave. For example, the driver circuit 224 may be a class E amplifier. A filter and matching circuit 226 may be also included to filter out harmonics or other unwanted frequencies and match the impedance of the transmitter 204 to the transmit antenna 214. As a result of driving the transmit antenna 214, the transmitter 204 may wirelessly output power at a level sufficient for charging or power an electronic device. As one example, the power provided may be for example on the order of 300 milliWatts to 20 Watts to power or charge different devices with different power requirements. Higher or lower power levels may also be provided. In one embodiment, the transmit antenna 214 and the receive antenna 218 may communicate via a Bluetooth Low Energy (BLE) link.

The receiver 208 may include receive circuitry 210 that may include a matching circuit 232 and a rectifier and switching circuit 234 to generate a DC power output from an AC power input to charge a battery 236 as shown in FIG. 2 or to power a device (not shown) coupled to the receiver 208. The matching circuit 232 may be included to match the impedance of the receive circuitry 210 to the receive antenna 218. The receiver 208 and the transmitter 204 may additionally communicate on a separate communication channel 219 (e.g., Bluetooth, zigbee, cellular, etc). The receiver 208 and transmitter 204 may alternatively communicate via in-band signaling using characteristics of the wireless field 205.

As described more fully below, the receiver 208, that may initially have a selectively disablable associated load (e.g., the battery 236), may be configured to determine whether an amount of power transmitted by the transmitter 204 and receiver by the receiver 208 is appropriate for charging a battery 236. Further, the receiver 208 may be configured to enable a load (e.g., the battery 236) upon determining that the amount of power is appropriate. In some embodiments, the receiver 208 may be configured to directly utilize power received from a wireless power transfer field without charging of the battery 236. For example, a communication device, such as a near-field communication (NFC) or radio-frequency identification device (RFID) may be configured to receive power from a wireless power transfer field and communicate by interacting with the wireless power transfer field and/or utilize the received power to communicate with the transmitter 204 or other devices.

Figure 3:
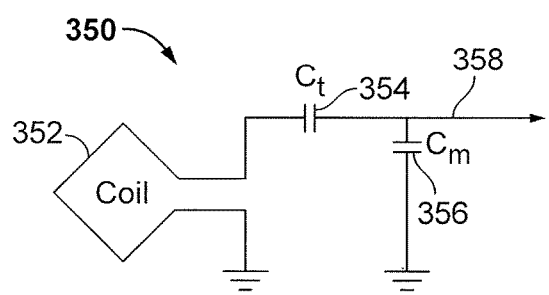
FIG. 3 is a schematic diagram of a portion of transmit circuitry or receive circuitry of FIG. 2 including a transmit or receive antenna, in accordance with exemplary embodiments of the invention.

FIG. 3 is a schematic diagram of a portion of transmit circuitry 206 or receive circuitry 210 of FIG. 2 including a transmit or receive antenna 352, in accordance with exemplary embodiments of the invention. As illustrated in FIG. 3, transmit or receive circuitry 350 used in exemplary embodiments including those described below may include an antenna 352 (or "loop" antenna). The antenna 352 may be configured to include an air core or a physical core such as a ferrite core (not shown). Air core loop antennas may be more tolerable to extraneous physical devices placed in the vicinity of the core. Furthermore, an air core loop antenna 352 allows the placement of other components within the core area. In addition, an air core loop may more readily enable placement of the receive antenna 218 (FIG. 2) within a plane of the transmit antenna 214 (FIG. 2) where the coupled-mode region of the transmit antenna 214 (FIG. 2) may be more powerful. The antenna 352 may be a coil (e.g., an induction coil) and/or an RF antenna, or any other suitable device to wirelessly receive or output power. The antenna 352 may be implemented with a Litz wire or as an antenna strip designed for low resistance. The antenna 352 may not need "turns" to be of a practical dimension. An exemplary implementation of the antenna 352 may be "electrically small" (e.g., a fraction of the wavelength) and tuned to resonate at a usable low frequency by using capacitors to define the resonant frequency.

As stated, efficient transfer of energy between the transmitter 104 and receiver 108 may occur during matched or nearly matched resonance between the transmitter 104 and the receiver 108. However, even when resonance between the transmitter 104 and receiver 108 are not matched, energy may be transferred, although the efficiency may be affected. Transfer of energy occurs by coupling energy from the field 105 of the transmit antenna 214 coil to the receive antenna 218 residing in the neighborhood where this field 105 is established rather than propagating the energy from the transmit antenna 214 into free space.

The resonant frequency of the loop or magnetic antennas is based on the inductance and capacitance. Inductance may be simply the inductance created by the antenna 352, whereas, capacitance may be added to the antenna's inductance to create a resonant structure at a desired resonant frequency. As a non-limiting example, the capacitor 356 and the capacitor 354 may be added to the transmit or receive circuitry 350 to create a resonant circuit that selects a signal 358 at a resonant frequency. Accordingly, for larger diameter antennas, the size of capacitance needed to sustain resonance may decrease as the diameter or inductance of the loop increases. Furthermore, as the diameter of the antenna increases, the efficient energy transfer area of the near-field may increase. Other resonant circuits formed using other components are also possible. As another non-limiting example, a capacitor may be placed in parallel between the two terminals of the antenna 350. For transmit antennas, a signal 358 with a frequency that substantially corresponds to the resonant frequency of the antenna 352 may be an input to the antenna 352.

In one embodiment, the transmitter 104 may be configured to output a time varying magnetic field with a frequency corresponding to the resonant frequency of the transmit antenna 114. When the receiver is within the field 105, the time varying magnetic field may induce a current in the receive antenna 118. As described above, if the receive antenna 118 is configured to be resonant at the frequency of the transmit antenna 114, energy may be efficiently transferred. The AC signal induced in the receive antenna 118 may be rectified as described above to produce a DC signal that may be provided to charge or to power a load.

Figure 4:
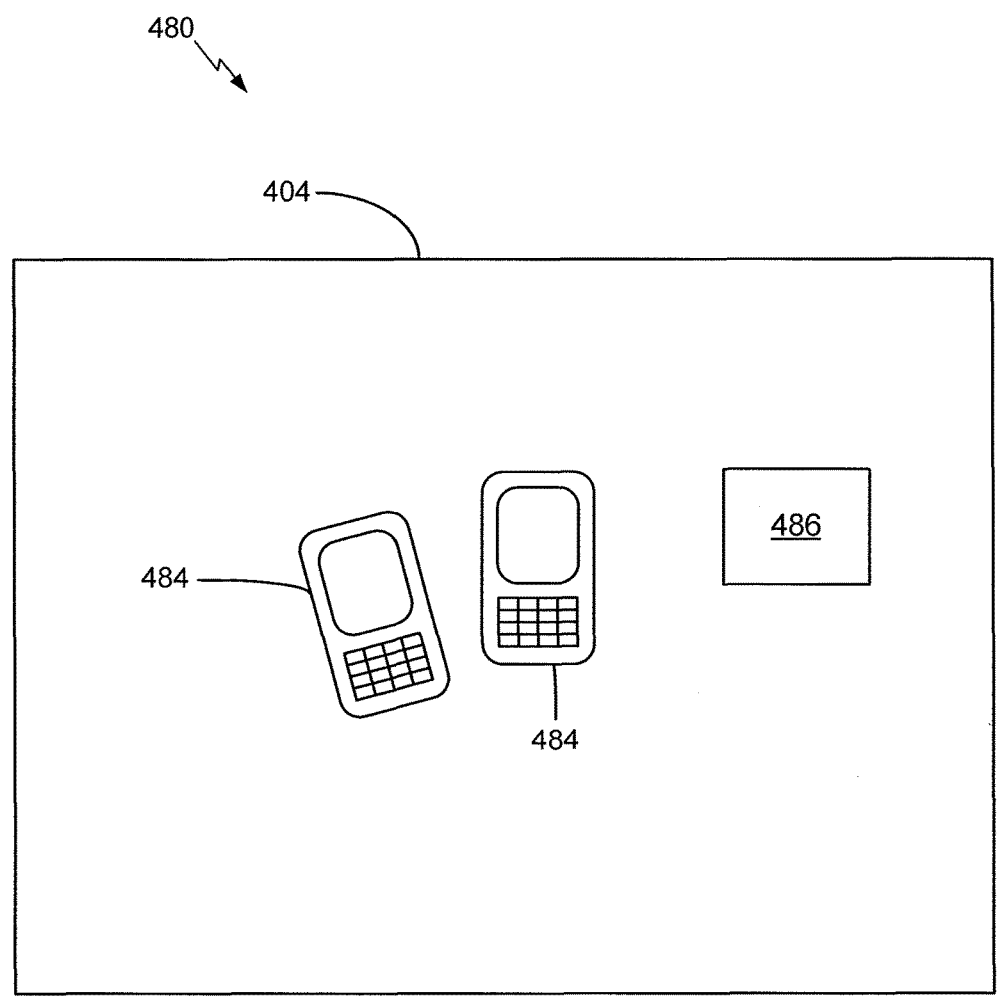
FIG. 4 illustrates a wireless power system including a wireless power transmitter and receivers, according to an exemplary embodiment of the invention.

FIG. 4 illustrates a wireless power system 480 including a power transfer unit "PTU" 404 (e.g., a power transfer unit that provides wireless charging) and one or more power receive units "PRUs" 484 (e.g., power receive units that are wirelessly chargeable devices), according to an exemplary embodiment of the invention. The PTU 404 may create a magnetic field which couples to the PRU 484. The PRU 484 may convert magnetic energy received from the PTU 404 into electrical energy. The PRUs 484 may include devices such as cellular phones, portable music players, computers, laptop computers, tablet computers, computer peripheral devices, communication devices (e.g., Bluetooth headsets), digital cameras, hearing aids (and other medical devices), etc. In one embodiment, the PRU 484 may be connected to a device to be charged which draws on the electrical energy. In another embodiment, the device to be charged may be integrated into the PRU 484. The PRU 484 may be placed on the PTU 404 for the purpose of charging the PRU 484. In one embodiment, the PTU 404 and the PRU 484 may communicate via a Bluetooth Low Energy (BLE) link.

In one embodiment, the wireless power system 480 includes a non-compliant object 486 (or "non-compliant device," "foreign object," or "foreign device"), which may comprise a non-compliant device or component. The non-compliant object 486 may include a damaged device, a device not built to the correct specifications (e.g., not in compliance with a charging standard, such as the system specifications of the Alliance for Wireless Power (A4WP)), or any other metal object that couples to the magnetic field (e.g., jewelry, eye-glasses, key-chains, etc.). In one embodiment, the non-compliant object 486 may be any object or device that is unable to communicate with the PTU 404 and function with the system control algorithm, which allows the PTU 404 no method to regulate or detect the electrical energy consumed by the non-compliant object 486. Since the PTU 404 creates a magnetic field, electrical energy may be transferred to any device or object that couples to the PTU 404 magnetic field. The non-compliant object 486 and each of the one or more PRUs 484 may be positioned within, near, or around a charging region of the PTU 404, which may cause the PRUs 484 to couple to the PTU 404 magnetic field and absorb electrical energy. In this way, the non-compliant object may affect the consumption of power transmitted by the PTU 404 and/or affect the charging region when it is within, near, or around the charging region. The energy absorbed may be dissipated as heat, which may damage the non-compliant object 486, harm or burn the user, cause a fire, damage the PTU 404, or create any other safety issue. Without a non-compliant object or non-compliant device detection system, the PTU 404 may continue to transfer power to the non-compliant object 486 indefinitely. According to one or more methods, the PTU 404 may be configured to detect the non-compliant object 486, as described below. As mentioned, the PTU 404 may be configured to detect, according to one or more methods, one or more of the non-compliant objects 486 affecting an associated charging region. The PTU 404 may detect the non-compliant object 486 using a method based on system measurements taken on both the PTU 404 and the PRU 484. If the non-compliant object 486 is consuming power greater than a specified threshold for several consecutive samples, then the PTU 404 may determine with high probability whether the non-compliant object 486 is present in the PTU 404 magnetic field. In one embodiment, the several consecutive samples may be based on a system of flag counters (e.g., lost power flags, dynamic load flags, etc.), as will be discussed below in regards to lost power flag counter, $N_{flag}$, in the description of FIG. 5. As also further described below, the PTU 404 may compare power measured into the PTU 404 coil, power measured at the PRU 484 rectifier output, and power lost in the system. In one embodiment, the power measured into the PTU 404 coil may be based on a current driven into the PTU 404 coil.

The PTU 404 may comprise a wireless power transmitter (e.g., the transmitter 104 of FIG. 1) that may transmit power to the PRU 484 within, near or around an associated charging region. According to one exemplary embodiment, the PTU 404 may be configured to determine whether or not said transmitted power is unaccounted for (e.g., if the non-compliant object 486 is consuming power). According to another exemplary embodiment, the PTU 404 may be configured to further determine whether the non-compliant object 486 is consuming power greater than a specified threshold. The specified threshold may be a fixed value, or it may be dynamically changed based on various specifications of the system components (e.g., a system operating point changing its output power, a dynamic load demanding a variable amount of power, etc.), as further described below.

As mentioned above, the PTU 404 may be configured to determine whether transmitted power is unaccounted for, e.g., if the non-compliant object 486 is consuming power. To accomplish this, power may be measured on the PTU 404 and compared with power measured on the PRU 484.

In one embodiment, it may be desirable for the power measurements made on the PTU 404 and the PRU 484 to be synchronized. Having synchronized and aligned these measurements, the PTU 404 may be configured to detect changes in power during each power measurement. For example, the PTU 404 may measure 10 W into its coil and the PRU 484 may measure 10 W consumed for several consecutive samples. If, in this example, on the next sample, the PTU 404 measures 10.1 W into its coil, the PTU 404 may detect the difference of 0.1 W. If the PRU 484 does not measure the same increase of 0.1 W, the PTU 404 may detect lost power.

If the PTU 404 and the PRU 484 measurements were made with complete accuracy and efficiency and the non-compliant object 486 was not present, then equation (1) would apply.

$$0=P_{in}-(P_{rect1}+P_{rect2}+\ldots+P_{rect,n}) \quad (1)$$

$P_{in}$ is the power measured into the PTU 404 coil. $P_{rect,n}$ is the rectified power (e.g., the power measured out) of the PRU 484 rectifier for any number of PRUs 484 on a given PTU 404.

If the non-compliant object 486 was present in the wireless power system 480, the measured $P_{in}$ would increase while the measured sum of $P_{rect}$ values would not change. In that situation, equation (2) would apply.

$$P_{lost}=P_{in}-(P_{rect1}+P_{rect2}+\ldots+P_{rectN}) \quad (2)$$

$P_{lost}$ is the power lost (e.g., unaccounted for) in the wireless energy transfer due to the non-compliant object 486 power consumption.

Since the PTU 404 and PRU 484 may not be lossless, a derivation is included which accounts for losses (e.g., coil losses, parasitic resistance, diode losses, induction heating, etc.). The PTU 404 may have coil losses (e.g., R1), where the coil loss is as shown in Equation (2b):

$$P_{r1}=(I_{TX}^2 * R_1) \quad (2b)$$

$I_{TX}$ is the current measured into the PTU 404 coil. $R_1$ is the parasitic resistance of the PTU 404 coil.

The PRU 484 may have coil losses ($P_{coil}$), diode losses ($P_{diodes}$), filter losses ($P_{EM1\_filter}$), and/or other parasitics in the circuitry ($P_{tuning}$, $P_{BSF}$, $P_{currentsense}$, etc.). These losses are represented by $P_{diss_N}$, which represents the total power dissipated on the PRU 484 between the coil and current sense circuit, for a given operating point. Equation (3) then represents power dissipated.

$$P_{diss}=P_{coil}+P_{tuning}+P_{EM1\_filter}+P_{diodes}+P_{BSF}+P_{current\,sense} \quad (3)$$

An additional source of power lost on the PRU 484 may be due to induction heating. For example, when the PRU 484 couples to the time varying magnetic field created by the PTU 404 (as described above), resistive losses during electromagnetic induction (in any conductive portion of the PRU 484) may cause the PRU 484 to dissipate power in the form of heat. A resistor, deltaR1, models this power lost, which is considered to be in series with the PTU 404 coil resistance, R1, as in (2b). The induction heating losses ($P_{indN}$) are calculated for each PRU 484 as in Equation (4).

$$P_{indN}=I_{TX}^2 * deltaR_{1_N} \quad (4)$$

To compare the power measured into the PTU 404 coil, $P_{in}$, and the power consumed by the PRU 484, an additional parameter is introduced called the PRU 484 acknowledged power, Equation (5).

$$P_{ack_N}=P_{rect_N}+P_{diss_N}+P_{ind_N} \quad (5)$$

$P_{ack,n}$ is the real power a PRU 484 acknowledges consuming. This includes the losses described with $P_{diss}$, the induction heating losses ($P_{indN}$), and the PRU 484 rectified power ($P_{rectN}$). Not accounting for unit-to-unit component tolerances, power lost ($P_{lost}$) is represented by Equation (6). In other embodiments, calculations may account for unit-to-unit component tolerances, which may refer to a difference of a component value from its nominal value, due to manufacturing variability. For example, the transmit circuitry 206 and/or the receive circuitry 210 may contain a capacitor. The capacitor may be listed, for example, as a 100 pF capacitor on a design schematic. However, the 100 pF capacitor used may comprise a tolerance value (e.g., 1%, 5%, etc.). Thus, the actual capacitance value may vary from 100 pF by the respective tolerance percentage. Each component within the transmit circuitry 206 (of the PTU 404) and/or the receive circuitry 210 (of each PRU 484) may have some level of tolerance, which may result in a varying unit-to-unit tolerance.

$$P_{lost} = P_{in} - P_{r1} - (P_{ack1} + P_{ack2} + \ldots + P_{ackN}) \quad (6)$$

In Equation (6), all key losses in the system are accounted for, as compared to equation (2), which assumes lossless operation.

The PTU 404 and/or the PRU 484 components may comprise measurement tolerance values (or any other tolerance value as discussed herein). The tolerance values may comprise a measurement difference range between a reported power measurement and an expected power measurement. The measurement difference range may comprise an upper tolerance percentage at which the reported power measurement exceeds the expected power measurement and a lower tolerance percentage at which the reported power measurement is less than the expected power measurement. In one embodiment, the PTU 404 may be configured to determine a first adjusted power measurement (e.g., $P_{in\_min}$ as further discussed below) based on the lower tolerance percentage of the tolerance value of each of the at least one component of the PTU 404. In another embodiment, the PTU 404 may be configured to determine a second adjusted power measurement (e.g., $P_{ack\_max}$ as further discussed below) based on the upper tolerance percentage of the tolerance value of each of the at least one component of the PRU 484.

For example, without further modification to the above equations, the PTU 404/PRU 484 system may falsely identify the non-compliant object 486 (e.g., generate a false positive for lost power) if $P_{in_{actual}}$ is the actual measured power at the PTU 404 (e.g., 10 W). There exists a ±'y' measurement tolerance ($P_{in_{tol}}$) that may cause the reported power into the coil ($P_{in_{report}}$) to be different than the actual power. For example, if the PTU 404 dissipates an actual 10 W and the measurement circuitry comprises a tolerance of ±20%, then the possible outputs are laid out in Table 1. For example, given an actual 10 W power output from the PTU 404 coil, the PTU 404 may report anywhere from 8 W to 12 W in the PTU 404 coil.

| Actual Power Into PTU Coil $P_{in_{actual}}$ | Measurement Tolerance $P_{in_{tol}}$ | Reported Power Into PTU Coil $P_{in_{report}}$ |
|---|---|---|
| 10 W | 0% | 10 W |
| 10 W | −20% | 8 W |
| 10 W | +20% | 12 W |

Table 1 shows the possible outputs (reported powers).

A similar tolerance concept as above applies to the acknowledged power measured on the PRU 484. For example, the actual acknowledged power ($P_{ack_{actual}}$) may be 10 W, but since the tolerance of the measurement circuitry ($P_{ack_{tol}}$) is, for example, ±20%, the PRU 484 may report an acknowledged power ($P_{ack_{report}}$) from 8 W to 12 W. The above two measurement tolerance (e.g., threshold) issues are shown numerically in Table 2, where the discrepancy between actual ($P_{in_{actual}}$) and reported ($P_{ack_{report}}$) is demonstrated.

TABLE 2

| $P_{in_{actual}}$ | $P_{in_{tol}}$ | $P_{in_{report}}$ | $P_{ack_{actual}}$ | $P_{ack_{tol}}$ | $P_{ack_{report}}$ |
|---|---|---|---|---|---|
| 10 W | 0% | 10 W | 10 W | 0% | 10 W |
| 10 W | −20% | 8 W | 10 W | −20% | 8 W |
| 10 W | +20% | 12 W | 10 W | +20% | 12 W |

Given the above situation, lost power ($P_{lost}$) may be calculated using Equation (6), as shown in Table 3, which demonstrates that a false positive would be generated in two out of three instances. The false positive was created because the PRU 484 reported less power than it was actually consuming, and the PTU 404 reported more power than it was actually outputting. The net difference in this situation appears as lost power ($P_{lost}$).

| $P_{in_{actual}}$ | $P_{ack_{actual}}$ | $P_{in_{report}}$ | $P_{ack_{report}}$ | $P_{lost}$ |
|---|---|---|---|---|
| 10 W | 10 W | 10 W | 8 W | 2 W |
| 10 W | 10 W | 8 W | 8 W | 0 W |
| 10 W | 10 W | 12 W | 8 W | 4 W |

Table 3 highlights the false positive case, assuming R1 losses are zero.

To avoid the generation of false positives, the calculations incorporate unit-to-unit tolerances (e.g., variances) and measurement tolerances (e.g., errors). As can be seen in Table 3, the reported powers for the PTU 404 and the PRU 484 have minimums (e.g., the lowest value in any one column) and maximums (e.g., the highest value in any one column). Using the minimum $P_{in}$ ($P_{in\_min}$) (the minimum power measured by AC power measurement) and the maximum $P_{ack}$ ($P_{ack\_max_N}$) (the maximum possible acknowledged power) values, the calculation for $P_{lost}$ may no longer contain false positives, as demonstrated in Table 4.

TABLE 4

| $P_{in_{actual}}$ | $P_{ack_{actual}}$ | $P_{in_{report}}$ | $P_{ack_{report}}$ | $P_{lost}$ |
|---|---|---|---|---|
| 10 W | 10 W | 8 W | 12 W | −4 W |
| 10 W | 10 W | 8 W | 12 W | −4 W |
| 10 W | 10 W | 8 W | 12 W | −4 W |

The above approach (e.g., calculating lost power using the minimum $P_{in}$ and the maximum $P_{ack}$) may be applied when accounting for measurement tolerance and unit-to-unit tolerance (e.g., variance). Adjusting Equation (6) to account for the above results in Equation (7):

$$P_{lost} = P_{in\_min} - (P_{ack\_max_1} + P_{ack\_max_2} + \ldots + P_{ack\_max_N}) \quad (7)$$

When calculating the minimum and maximum values for a reported variable, the ±20% error is based on the actual value of the variable, not the reported value (e.g., after tolerance error). For example, if the actual voltage is 10V, and due to a voltage tolerance ($V_{tol}$) of 20%, the reported voltage ($V_{report}$) is 8V, then the maximum voltage ($V_{max}$) may be calculated according to Equation (8):

$$V_{max} = \frac{V_{report}}{1 - V_{tol}} = \frac{8}{1 - 0.2} = 10 \text{ V} \quad (8)$$

This approach is used in calculations for the maximum value of a reported variable where the accuracy is unknown.

When calculating the minimum possible $P_{in}$ ($P_{in\_min}$), measurement error and unit-to-unit tolerances (e.g., induced errors) are accounted for. Expanding on Equation (2b), the equation for $P_{in\_min}$ is shown in (9).

$$P_{in\_min} = P_{in} - P_{r1} \quad (9)$$

Since $P_{in}$ includes a constant tolerance, that error ($P_{in_{tol}}$) is subtracted from the reported value, as shown in Equation (10):

$$P_{in\_min} = P_{in} - P_{in_{tol}} - P_{r1} \quad (10)$$

Any discrepancy between the actual value ($P_{in_{actual}}$) and the reported value ($P_{in}$) may be accounted for by subtracting this error ($P_{in_{tol}}$). A similar method is used for the measurement and unit-to-unit error of $P_{r1}$, which is found using Equation (2b). The PTU 404 coil may have a coil resistance value, which in one embodiment, may be a nominal resistance value. As described above in regards to unit-to-unit tolerance values, manufacturing variance may cause the resistance value to vary from one coil to another. Thus, the calculations may implement a coil resistance tolerance value. Using a similar approach as described in Equation (10), and to account for a current tolerance (as described below) and the coil resistance tolerance, the final calculation for $P_{in\_min}$ is shown in Equation (11).

$$P_{in\_min} = P_{in} - P_{in_{tol}} - \left(\frac{Ac_{cur}}{1 - Ac_{cur_{tol}}}\right)^2 * R_1 * (1 + R_{1_{tol}}) \quad (11)$$

The maximum power acknowledged at the Nth PRU 484 may be calculated using Equation 12.

$$P_{ack\_max_N} = \Sigma_{All\ PRUs}(P_{rect\_max_N} + P_{diss\_max_N} + P_{ind\_max_N}) \quad (12)$$

The maximum $P_{rect}$ on each PRU 484, $P_{rect\_max_N}$, may be calculated using Equation (13):

$$P_{rect\_max_N} = V_{rect\_max_N} * I_{rect\_max_N} \quad (13)$$

To calculate $V_{rect\_max_N}$, assuming $V_{rect_N}$ includes a maximum tolerance of ±3%, the equation would be as shown in Equation (14):

$$V_{rect\_max_N} = \frac{V_{rect_N}}{1 - V_{rec\_tol}} = \frac{V_{rect_N}}{1 - 0.03} \quad (14)$$

$I_{rect\_max_N}$ may be calculated in a similar manner; however, the current tolerance (e.g., $I_{rect_{tol}}$) for $I_{rect_N}$ is not constant, so to calculate $I_{rect\_max_N}$ using $I_{rect_N}$, an iterative process to solve for $I_{rect_N}$ is used. This process incorporates the actual PRU 484 $P_{rect}$ and tolerance, which may be identified using Table 5.

TABLE 5

| $P_{rect}$ (W) | Tolerance (%) | |
|---|---|---|
| | Category 2 | Category 3 |
| 0.25 | 140 | 260 |
| 0.5 | 70 | 130 |
| 1 | 35 | 65 |
| 1.5 | 23.3 | 43.3 |
| 2 | 17.5 | 32.5 |

TABLE 5-continued

| $P_{rect}$ (W) | Tolerance (%) | |
|---|---|---|
| | Category 2 | Category 3 |
| 2.5 | 14 | 26 |
| 3 | 11.7 | 21.7 |
| 3.5 | 10 | 18.6 |
| 4 | | 16.3 |
| 4.5 | | 14.4 |
| 5 | | 13 |
| 5.5 | | 11.8 |
| 6 | | 10.8 |
| 6.5 | | 10 |

For example, if $P_{rect}$ is 3 W and a Category 3 PRU 484 is being used, $I_{rect\_max_N}$ may be calculated with $I_{rect_{tol}}$ at a value of, for example, 21.7%. $I_{rectN}$ may be calculated as the y-value in a slope equation after interpolating the values from Table 5, as demonstrated below:

The slope (m) is found using Equation (15):

$$m = \frac{y_2 - y_1}{x_2 - x_1} \quad (15)$$

For example, the slope for an actual $P_{rect}$ of 1.2 W on a Category 3 PRU 484 can be calculated using Equation (16):

$$m = \frac{y_2 - y_1}{x_2 - x_1} = \frac{43.3 - 65}{1.5 - 1} = -43.4 \quad (16)$$

The offset (b) is found using Equation (17):

$$b = y_2 - m * x_2 \quad (17)$$

For example, the offset for an actual $P_{rect}$ of 1.2 W on a category 3 PRU 484 would be calculated using Equation (18):

$$b = y_2 - m * x_2 = 43.3 - (-43.4) * 1.5 = 108.4 \quad (18)$$

Finally, the $I_{rect_N}$ tolerance, using the above values as an example, would be calculated as shown in Equation 19.

$$Y = mX + b = -43.4 * 1.2 + 108.4 = 56.32\% \quad (19)$$

Using this method, $I_{rectN}$ may be calculated; however, since the real value of $P_{rect}$ is unknown, it also may be determined based on an iterative process using the reported $P_{rect}$ in the following manner. First, a value for $P_{rect\_max_N}$ may be assumed (e.g., 2 W). Using 2 W as an example, the $I_{rect_N}$ tolerance based on equation (19) and using a Category 3 PRU 484 would be ±32.5%. The tolerance of $V_{rect_N}$ is generally ±3%. Using these tolerances, the minimum possible reported $P_{rect}$ may be calculated. If the calculated minimum possible reported $P_{rect}$ is equal to the actual reported value (within some threshold described below), then $P_{rect\_max_N}$ is the value originally assumed (e.g., 2 W). However, if the calculated minimum possible reported $P_{rect}$ is not equal to the actual reported value (within some threshold described below), then a new $P_{rect\_max_N}$ may be assumed and the process repeated until a match (within some threshold described below) is found.

As mentioned above, the "match" between the actual reported value for $P_{rect}$ and the calculated minimum possible reported $P_{rect}$ may be within a threshold. The threshold may be based on theoretical, simulated, or experimental data. The threshold may also be set as low as possible without imposing memory constraints or time delays in calculation. For example, to avoid long and complex calculations, the threshold may be set greater than 10 μW. The threshold may also be set low enough (e.g., below 1 W) to maintain the accuracy of measured power lost. In one embodiment, the threshold may be set to be on the order of 10 mW. For example, if a threshold of 10 mW is used, then the minimum possible reported $P_{rect}$ may be up to 10 mW greater than the actual reported $P_{rect}$. As a result, the minimum possible reported value may not be greater than the actual reported value.

Each PRU 484 may report a different $P_{rect}$ and the tolerance for $I_{rect_N}$ varies by the PRU 484 category. As such, this iterative calculation may be completed for each PRU 484.

Induction heating caused by a PRU 484 is modeled as a resistor in series with the PTU 404 coil current, known as deltaR1. A PRU 484 with a large deltaR1 value may dissipate more power (e.g., create more heat) than a PRU 484 with a smaller deltaR1. The induction heating on a specific PRU 484 may be calculated using Equation (20).

$$P_{ind_N} = Ac_{cur}^2 * deltaR1_N \tag{20}$$

$(Ac_{cur})^2$ is the AC current flowing to the PRU 484. Using the maximum deltaR1 value for a specific PRU 484 on a specific PTU 404, the induction heating caused by a PRU 484 may be lower than the maximum induction heating caused by each PRU 484 as calculated in Equation (21):

$$P_{ind\_max_N} = \left(\frac{Ac_{cur}}{1 - Ac_{cur_{tol}}}\right)^2 * deltaR1\_max_N \tag{21}$$

As demonstrated, a PRU's 484 dissipated power is calculated by Equation (3). However, since it is not possible to measure the power dissipated in each of the PRU's 484 circuit blocks, Equation (22) demonstrates how the PRU 484 calculates the maximum possible power dissipated on each PRU 484:

$$P_{diss_N} = P_{rect\_conv\_N} * V_{rect_N} * I_{rect_N} \tag{22}$$

The PRU 484 converts its $P_{rect}$ into its power dissipated by using the constant proportional factor, $P_{rect\_conv\_N}$. This conversion factor may be different for every PRU 484 design and may report the PRU's 484 $P_{diss_N}$ with a power dissipated tolerance of at least ±50%. Since the power dissipated includes a tolerance, the maximum power dissipated may be calculated from the value the PRU 484 reports to the PTU 404, as shown in Equation (23).

$$P_{diss\_max_N} = \frac{P_{diss_N}}{1 - P_{diss_{tol\_max}}} = \frac{P_{diss_N}}{1 - 0.5} \tag{23}$$

Equation (23) ensures that the actual power dissipated may never be greater than the calculated maximum power dissipated. A maximum tolerance less than 50% may be reported if the PRU 484 design comprises a greater accuracy. In such a case, the PRU 484 would report a variable $P_{diss_{tol}\_N}$ and use Equation (24), rather than Equation (23) to calculate $P_{diss\_max_N}$.

$$P_{diss\_max_N} = \frac{P_{diss_N}}{1 - P_{diss_{tol\_N}}} \tag{24}$$

In the case that the PRU 484 demands a variable amount of power (e.g., the PRU 484 is a "dynamic load"), the PTU 404 may lose synchronization between power measured on the PTU 404 and PRU 484. This loss of synchronization may create errors and may lead to false-positive detection of a non-compliant object or non-compliant device. To prevent these problems in the case of a dynamic load, Equation (25) is used to detect the presence of dynamic loads:

$$ABS(Ac_{pwr} - Ac_{pw\_prev}) > Dyn_{thresh} \tag{25}$$

ABS(x) represents the absolute value of the value within the parentheses (x). $Ac_{pwr}$ represents the AC power measured into the PTU 404 coil at the current time, and $AC_{pwrprev}$ represents the previously measured AC power into the PTU 404 coil. If the power measured into the PTU 404 coil changes by more than the threshold ($Dyn_{thresh}$), it is assumed that there is a dynamic load present and a dynamic load counter flag is set, $Dyn_{flag}$ (as further described below).

Figure 5:
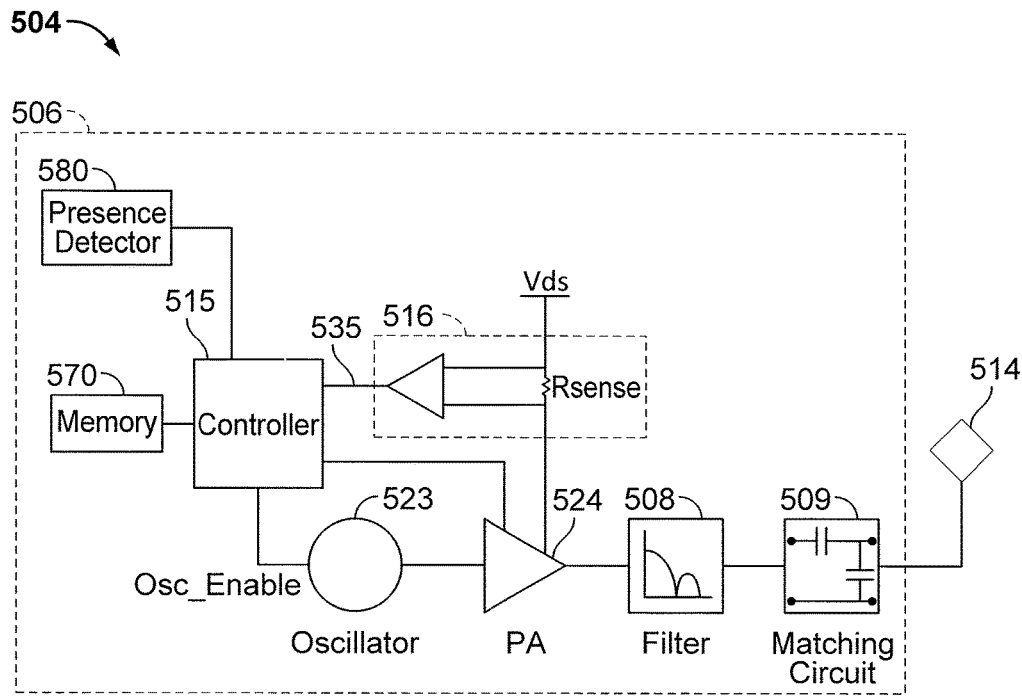
FIG. 5 is a functional block diagram of a transmitter that may be used in the wireless power transfer system of FIG. 1, in accordance with exemplary embodiments of the invention.

FIG. 5 is a functional block diagram of a PTU 504 (such as the PTU 404) that may be used in the wireless power transfer system of FIG. 1, in accordance with exemplary embodiments of the invention. The PTU 504 may receive power through a number of power sources, e.g., an AC-DC converter (not shown) to convert conventional AC power present in a building, a DC-DC converter (not shown) to convert a conventional DC power source to a voltage suitable for the PTU 504, or directly from a conventional DC power source (not shown).

The PTU 504 may include a transmit antenna 514 for generating an electromagnetic or magnetic field, hereinafter referred to as a "charging region." The transmit antenna 514 may be a coil (e.g., an induction coil) and/or an RF antenna, or any other suitable device to wirelessly output power. The transmit antenna 514 may be implemented with a Litz wire or as an antenna strip designed for low resistance. In one implementation, the transmit antenna 514 may be associated with a larger structure, such as a table, mat, lamp, or other stationary configuration. Accordingly, the transmit antenna 514 may not need "turns" to be of a practical dimension. An exemplary implementation of the transmit antenna 514 may be "electrically small" (e.g., a fraction of the wavelength) and tuned to resonate at a usable low frequency by using capacitors (e.g., the capacitors 354 and 356 of FIG. 3) to define the resonant frequency. In an exemplary embodiment, the transmit antenna 514 (or another antenna) may transmit power to a receiver device (e.g., the PRU 484) within, near, or around the charging region. In an exemplary embodiment, the transmit antenna 514 (or another antenna) may receive an acknowledgement from the PRU 484 regarding the amount of power it has received, as described in connection with FIG. 4. The transmit antenna 514 (or another antenna) may also receive information from the PRU 484 about the various specifications of the PRU 484, as described below. The transmit antenna 514 (or another antenna) may also receive confirmation from the PRU 484 that the PRU 484 is fully charged. In one embodiment, the transmit antenna 514 (or another antenna) may communicate with the PRU 484 via a Bluetooth Low Energy (BLE) link.

In one exemplary embodiment, the PTU 504 may not remain on indefinitely. This prevents the PTU 504 from running long after the PRUs 484 in its perimeter are fully charged, which may occur if the transmit antenna 514 fails to receive or receives a faulty confirmation from the PRU 484 when it is fully charged. A user may program the PTU 504 to shut off after a desired amount of time. To prevent the PTU 504 from automatically shutting down if another PRU 484 is placed in its perimeter, the PTU 504 may shut off automatically after a set period of lack of motion detected in its perimeter, as described below. The user may be able to set the inactivity time interval and change it as desired. As a non-limiting example, the time interval may be longer than that needed to fully charge the PRU 484 under the assumption that the PRU 484 is initially fully discharged.

The PTU 504 may further include transmit circuitry 506. The transmit circuitry 506 may include an oscillator 523 for generating oscillating signals (e.g., RF signals). The transmit circuitry 506 may provide RF power to the transmit antenna 514 via the RF signals, resulting in generation of energy (e.g., magnetic flux) about the transmit antenna 514. The PTU 504 may operate at any suitable frequency, e.g., the 6.78 MHz ISM band.

The transmit circuitry 506 may include a fixed impedance matching circuit 509 for matching the impedance of the transmit circuitry 506 (e.g., 50 ohms) to the transmit antenna 514. The transmit circuitry 506 may also include a low pass filter (LPF) 508 configured to reduce harmonic emissions to levels that prevent self-jamming of the PRUs 484. Other exemplary embodiments may include different filter topologies, such as notch filters that attenuate specific frequencies while passing others. The transmit circuitry 506 may further include a driver circuit 524 configured to drive the RF signals. Other exemplary embodiments may include an adaptive impedance match that may be varied based on measurable transmit metrics, such as output power to the transmit antenna 514 or DC current to the driver circuit 524. The transmit circuitry 506 may further comprise discrete devices, discrete circuits, and/or an integrated assembly of components. An exemplary RF power output from the transmit antenna 514 may be from 0.3 watts to 20 watts or may also be a higher or lower value.

The transmit circuitry 506 may further include a controller 515 for, among other functions, selectively enabling the oscillator 523 during transmit phases (or duty cycles) of the PRUs 484. The controller 515 may also adjust the frequency or phase of the oscillator 523. Adjusting the phase of the oscillator 523 and related circuitry in the transmission path may allow for reduction of out-of-band emissions, especially when transitioning from one frequency to another. The controller 515 may also adjust the output power level of the oscillator 523 to implement a communication protocol for interacting with the PRUs 484.

The controller 515 may also perform calculations based on data it sends and receives from other components in the transmit circuitry 506. For use in those calculations, the transmit circuitry 506 may also include a memory 570 for temporarily or permanently storing data. The memory 570 may also store various specifications of the components of the PTU 504 and/or the PRUs 484 for use in calculations as described below.

The controller 515 may gather and track information about the whereabouts and status of the PRUs 484 that may be associated with the PTU 504. Thus, the transmit circuitry 506 may include a presence detector 580 (e.g., a motion detector) to detect the initial presence of the PRU 484 to be charged when the PRU 484 enters the charging region and to turn on the PTU 504 in such an event. The presence detector 580 may detect the PRU 484 via the transmit antenna 514 or another appropriate antenna not shown in FIG. 5. The controller 515 may adjust the amount of power going to or from the driver circuit 524 in response to presence signals from the presence detector 580. The transmit antenna 514 may then transfer RF power to the PRU 484.

The transmit circuitry 506 may further include a load sensing circuit 516 for monitoring the current flowing to the driver circuit 524, which may be affected by the presence or absence of the PRUs 484 or a non-compliant device (e.g., the non-compliant object 486 of FIG. 4) in the vicinity of the charging region as detected by the presence detector 580. The controller 515 may also detect load changes on the driver circuit 524 to determine whether to enable the oscillator 523.

For use in detecting the presence of the non-compliant object 486 affecting the charging region, the controller 515 may determine whether and to what extent the power transmitted via the transmit antenna 514 is unaccounted for (e.g., determine the amount of lost power). The controller 515 may further set and/or modify an initial threshold value ($Dyn_{thresh}$) that represents an amount of power lost (as further described below), above which the detection of one or more non-compliant objects 486 will occur.

For use in determining the lost power, the controller 515 may calculate the minimum possible power that the PTU 504 ($P_{in\_min}$) may be drawing from its power source (not shown) (e.g., the minimum possible power the PTU 504 is measuring into its coil). To make this calculation, as described in connection with FIG. 4, the controller 515 may use various specifications of the PTU 504, e.g., the measurement tolerance of the components of the PTU 504 ($P_{in_{tol}}$), the PTU 504 component tolerances, etc.

Also for use in determining the lost power, the controller 515 may calculate the sum of the maximum possible powers that the transmit antenna 514 may acknowledge from the PRUs 484 ($P_{ack\_max_N}$) (e.g., the maximum possible power the PRU 484 acknowledges as consumed). To make this calculation, as described in connection with FIG. 4, the controller 515 may use various specifications of the PRU 484, e.g., the PRU 484 current received tolerance ($I_{rect_{tol}}$), the PRU 484 power dissipated tolerance ($I_{diss_{tol}}$), the PRU 484 induction heating, etc. In calculating $P_{ack\_max_N}$, the controller 515 may also account for the state of alignment in the time domain between samples obtained from the PTU 504 and samples obtained from the PRU 484. For example, if the controller 515 takes a first set of three samples from the PRU 484 and a second set of three samples from the PTU 504, it is desirable for the first set to correspond (e.g., align) in time with the second set. If the first and second sets do not correspond in time, then the controller 515 will reset and proceed to collect new samples.

$P_{in\_min}$ and $P_{ack\_max_N}$ may be implemented into an inequality as shown in Equation (26):

$$P_{in\_min} - P_{ack\_max_N} > Dyn_{thresh} \qquad (26)$$

If this inequality is true, the controller 515 detects lost power (and sets a lost power counter flag, $LP_{flag}$, as described below).

For use in Equation (26), the controller 515 may initially set $Dyn_{thresh}$ to a fixed value based on theoretical, simulated, or experimental data. In one embodiment, the controller 515 may set the initial threshold equal to an experimentally determined total system error. The controller 515 may determine the experimental total system error by obtaining measurements of actual power generated at the PTU 504 and actual power consumed (e.g., power used, power dissipated, etc.) by the PRU 484 when the non-compliant object 486 is not present. The controller 515 may then set the experimental total system error as the difference between the two measurements.

The controller 515 may also dynamically change $Dyn_{thresh}$ based on various specifications of the PTU 504 and/or the PRU 484, such as: (1) a dynamic load being present and/or the dynamic load demanding a variable amount of power; (2) a system operating point causing a change in the PTU 504 output power; (3) whether the PRU 484 is being charged; (4) measurement tolerances of the PTU 504 and/or the PRU 484; and (5) whether the PTU 504 is in "beacon mode" or "power transfer" mode.

As mentioned above, the controller 515 may adjust $Dyn_{thresh}$ in the case of a dynamic load being present. In one embodiment, the controller 515 may increase $Dyn_{thresh}$ in the case of a dynamic load being present. In one embodiment, if the PRU 484 is powered off, the controller 515 may not identify the PRU 484 as having or exhibiting a dynamic load. If the PRU 484 is powered on and consuming variable amounts of power (e.g., streaming video, playing loud music, etc.), the controller 515 may identify the PRU 484 as having or exhibiting a dynamic load. If the controller 515 identifies the PRU 484 as having or exhibiting a dynamic load, in one embodiment, the controller 515 may set $Dyn_{thresh}$ to a maximum value (e.g., effectively removing $Dyn_{thresh}$ as a constraint) until the identified dynamic load is removed. The controller 515 may ignore the dynamic load when the PTU 504 and PRU 484 measurements are synchronized.

In certain embodiments, a dynamic load that varies its power consumption at a higher frequency than desirable (e.g., varying between 3 W and 1 W once every 10 seconds) may create a false positive for lost power. In one embodiment, if the dynamic load varies at a frequency greater than a threshold frequency, the controller 515 may ignore changes to the lost power as a result of that load. In one embodiment, the controller 515 may set the threshold frequency to be 1 Hz, 2 Hz, 5 Hz, 10 Hz, etc. In another embodiment, the controller 515 may account for detecting a dynamic load even if the frequency at which the load varies is significantly higher than 10 Hz.

As mentioned above, the controller 515 may adjust $Dyn_{thresh}$ in the case of a system operating point changing its output power. Generally, the system operating point is based on or is indicative of the amount or magnitude of the power being transmitted by the PTU 504 and the power being consumed by the PRUs 484. The various error measurements taken at the PTU 504 and the PRU 484 generally vary proportionally to the level of power delivered by the PTU 504 and consumed by the PRU 484. Accordingly, the controller 515 will set a value of $Dyn_{thresh}$ at different system operating points in a way that the dynamic threshold is proportional to the magnitude. In one embodiment, if the power consumption of the PTU 504 and/or the PRUs 484 increases, the controller 515 may increase $Dyn_{thresh}$. In another embodiment, if the power consumption of the PTU 504 and/or the PRUs 484 decreases, the controller 515 may decrease $Dyn_{thresh}$. In yet another embodiment, if a variation of the power consumption of the PRU 484 is above a predetermined variation threshold, then the controller 515 may adjust $Dyn_{thresh}$ accordingly.

In one embodiment, when the PTU 504 outputs 10 W into its coil, the controller 515 may specify $Dyn_{thresh}$ to be 3 W. If the PTU 504 subsequently outputs 0.5 W into its coil, the controller 515 may modify $Dyn_{thresh}$ to be 1 W instead of 3 W.

As mentioned above, the controller 515 may adjust $Dyn_{thresh}$ based on whether the PRU 484 is being charged. As an example, the controller 515 may set $Dyn_{thresh}$ to be 3 W when the PTU 504 is charging the PRU 484. If the PTU 504 is not charging one or more PRUs 484, then the controller 515 may adjust $Dyn_{thresh}$ to be 1.5 W.

As mentioned above, the controller 515 may also adjust $Dyn_{thresh}$ based on the measurement tolerances of the PTU 504 and/or the PRU 484, as further described in relation to FIG. 4, Tables 1-4, and Equation (7) above.

As mentioned above, the controller 515 may adjust $Dyn_{thresh}$ based on whether the PTU 504 is in "beacon mode" or "power transfer" mode. When the PTU 504 is charging the PRU 484, the PTU 504 is in "power transfer mode." During power transfer mode, the controller 515 calculates lost power as described above. In one embodiment, the controller 515 may disable the output of the PTU 504 (e.g., disconnect the PTU 504 from the PRU 484), hereinafter referred to as "beacon mode" (or "low power state" or "power save state"). For example, to save power, the PTU 504 may temporarily exit a power transfer mode and enter a low power mode where the PTU 504 periodically transmits low power "beacon" signals to allow the PTU 504 to conserve power while allowing for detection of an incoming PRU 484 (e.g., enter beacon mode). During beacon mode, the calculation for lost power becomes as shown in Equation (27):

$$P_{lost} = P_{in_{min}} = P_{in} - P_{in_{tol}} - \left(\frac{Ac_{cur}}{1 - Ac_{cur_{tol}}}\right)^2 * R_1 * (1 + R_{1_{tol}}) \quad (27)$$

During beacon mode, the parasitic resistance (R1) is generally zero or negative. Therefore, lost power exists if $P_{in_{min}}$ is greater than zero. Also during beacon mode, there are a series of short and long coil current pulses. In one embodiment, the PTU 504 may not detect the PRU 484 using short pulses, but the PTU 504 may detect the PRU 484 with a long pulse. Therefore, during beacon mode, the controller 515 may take power measurements of the PRU 484 that are synchronized on the long pulses. If the PRU 484 was placed on the PTU 504 and did not connect on a short pulse when the controller 515 took a power measurement, the controller 515 may detect the power consumed by deltaR1 and assume it is lost power. The controller 515 may take these power measurements 10 ms after triggering a beacon pulse. This is meant to ensure that the beacon pulse reaches steady state before the controller 515 takes a measurement. Since long beacon pulses occur every second, it may take at least six seconds for the controller 515 to detect the non-compliant object 486 in beacon mode.

As mentioned above, when the controller 515 detects lost power (e.g., detects the presence of the non-compliant object 486), the controller 515 may not fault (e.g., may not turn off the PTU 504) immediately. Instead, it may set a lost power counter flag, $LP_{flag}$. The controller 515 may set this flag at each consecutive lost power detection. In addition, if the controller 515 detects a dynamic load, it may set a dynamic load flag, $Dyn_{flag}$. The flags and their associated counters are shown in Equations (28) and (29).

$$M_{flag} \geq Dyn_{flag} \quad (25)$$

$$N_{flag} > LP_{flag} \quad (29)$$

If the controller 515 sets enough flags consecutively, then the controller 515 may fault. This approach may decrease the probability of a false-positive lost power detection event causing the controller 515 to fault. In one embodiment, the controller 515 may account for the possibility that a small number of false-positives may exist, as described below.

In the case of a dynamic load being present (as discussed above in relation to FIG. 4), the PTU 504 and PRU 484 measurements may not be synchronized, resulting in multiple false positive flags. Therefore, in another embodiment, the controller 515 may wait for twelve consecutive lost power flags and then execute a fault condition if no more than two of those flags were also flagged as being a dynamic load. If the controller 515 detects twelve consecutive lost power flags and no more than two of those flags are also flagged as being a dynamic load, then the controller 515 may fault. In one embodiment, if the controller 515 faults four times in less than three minutes, the PTU 504 may latch. In another embodiment, the controller 515 may wait for six power loss flags before executing a fault condition. If the controller 515 executes four faults in less than three minutes, the PTU 504 may latch.

The controller 515 may reset the flag count in response to various system conditions. To determine when to reset the flag count, the controller 515 may poll the PRU 484 for dynamic data. In one embodiment, the time from the PRU 484 polling start to the PRU 484 reply may be less than 250 ms. In this example, the controller 515 may discard any results from a polling reply that takes longer than 250 ms for the controller 515 to receive and calculate. In one embodiment, the controller 515 may reset the flag count if more than two out of twelve consecutive measurements caused a dynamic load flag.

Figure 6:
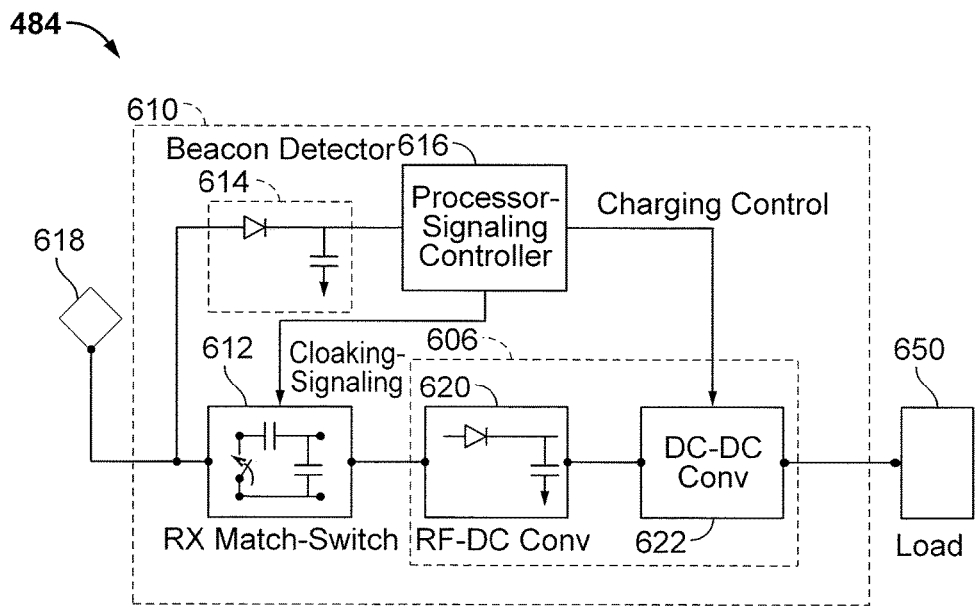
FIG. 6 is a functional block diagram of a receiver that may be used in the wireless power transfer system of FIG. 1, in accordance with exemplary embodiments of the invention.

FIG. 6 is a functional block diagram of the PRU 484 (as in FIG. 4) that may be used in the wireless power transfer system of FIG. 1, in accordance with exemplary embodiments of the invention.

The PRU 484 may include receive circuitry 610 comprising the various components of the PRU 484. The receive circuitry 610 may include a receive antenna 618 for receiving power from a transmit antenna (e.g., the transmit antenna 514 of FIG. 5). The PRU 484 may further couple to a load 650 for providing received power thereto. The load 650 may be external to the PRU 484, or the load 650 may be integrated into the PRU 484 (not shown). The receive circuitry 610 may further include a processor 616 for coordinating the processes of the PRU 484, as described below.

The receive antenna 618 may be tuned to resonate at a similar frequency, or within a specified range of frequencies, as the transmit antenna 514 (FIG. 5). The receive antenna 618 may be similarly dimensioned with the transmit antenna 514 or it may be differently sized based on the dimensions of the load 650. In one embodiment, the receive antenna 618 may communicate with the transmit antenna 514 via a Bluetooth Low Energy (BLE) link. This communication may allow the PRU 484 to send feedback data to the PTU 504, which may allow the PTU 504 to vary the strength of its magnetic field to adjust the electrical energy being transferred to the PRU 484. If the load 650 comprises a diametric or length dimension smaller than the diameter of length of the transmit antenna 514, then the receive antenna 618 may be implemented as a multi-turn coil to reduce the capacitance value of a tuning capacitor (not shown) and increase the receive coil's impedance. For example, the receive antenna 618 may be placed around the substantial circumference of the load 650 in order to maximize the antenna diameter and reduce the number of loop turns (e.g., windings) of the receive antenna 618 and the inter-winding capacitance.

To transmit power to the load 650, the energy from the transmit antenna 514 may be propagated wirelessly to the receive antenna 618 and then coupled through the rest of the receive circuitry 610 to the load 650.

For more efficient power transfer, the receive circuitry 610 may provide an impedance match to the receive antenna 618. To help accomplish this, the receive circuitry 610 may include power conversion circuitry 606 for converting a received RF energy source into charging power for use by the load 650.

The power conversion circuitry 606 may include an RF-to-DC converter 620 to rectify the RF energy signal received at the receive antenna 618 into a non-alternating power with an output voltage. The RF-to-DC converter 620 may be a partial or full rectifier, a regulator, a bridge, a doubler, a linear or switching converter, etc.

The power conversion circuitry 606 may also include a DC-to-DC converter 622 (or other power regulator) to convert the rectified RF energy signal into an energy potential (e.g., voltage) that is compatible with the load 650.

The receive circuitry 610 may further include switching circuitry 612 for connecting or disconnecting the receive antenna 618 to or from the power conversion circuitry 606. Disconnecting the receive antenna 618 from the power conversion circuitry 606 may suspend charging of the load 650 and/or change the "load" 650 as "seen" by the PTU 504.

When multiple PRUs 484 are present in the PTU 504 charging field, the processor 616 may be configured to time-multiplex (e.g., switch) the loading and unloading of one or more PRUs 484 to enable other PRUs 484 to more efficiently couple to the PTU 504. Unloading of the PRU 484 (hereinafter referred to as "cloaking" or "cloaked") may eliminate coupling to other nearby PRUs 484 or reduce loading on nearby PTUs 504. Cloaking may also occur upon the occurrence of other events, e.g., detection of an external wired charging source (e.g., wall/USB power) providing charging power to the load 650. The switching between unloading and loading may be detected by the PTU 504. Therefore, the switching between unloading and loading may be performed at a particular speed to function as a protocol that enables the sending of a message from the PRU 484 to the PTU 504. By way of example, the switching speed may be on the order of 100 μsec. Using this switching technique, the PRU 484 may be configured to send various specifications about the PRU 484 to the PTU 504, e.g., specifications for the PTU 504 to calculate $P_{in_{min}}$, $P_{ack\_max_N}$, and $Dyn_{thresh}$ (as described in FIGS. 4 and 5).

In an exemplary embodiment, communication between the PTU 504 and the PRU 484 refers to a device sensing and charging control mechanism, rather than conventional two-way communication (e.g., in band signaling using the coupling field). In other words, the PTU 504 may use on/off keying of the transmitted signal to adjust whether energy is available in the near-field. The PRU 484 may interpret these changes in energy as a message from the PTU 504. From the receiver side, the PRU 484 may use tuning and de-tuning of the receive antenna 618 to adjust how much power is being accepted from the field. In some cases, the tuning and de-tuning may be accomplished via the switching circuitry 612. The PTU 504 may detect this difference in power used from the field and interpret these changes as a message from the PRU 484. Other forms of modulation of the transmit power and the load 650 behavior may be utilized.

The receive circuitry 610 may further include signaling and beacon detector circuitry 614 to identify received energy fluctuations that may be informational signaling from the PTU 504 to the PRU 484. The processor 616 may monitor the signaling and beacon detector circuitry to determine a beacon state and extract messages sent from the PTU 504. Furthermore, the signaling and beacon detector circuitry 614 may be used to detect the transmission of a reduced RF signal energy (e.g., a beacon signal). The signaling and beacon detector circuitry 604 may further rectify the reduced RF signal energy into a nominal power for awakening either un-powered or power-depleted circuits within receive circuitry 610 in order to configure receive circuitry 610 for wireless charging.

Figure 7A:
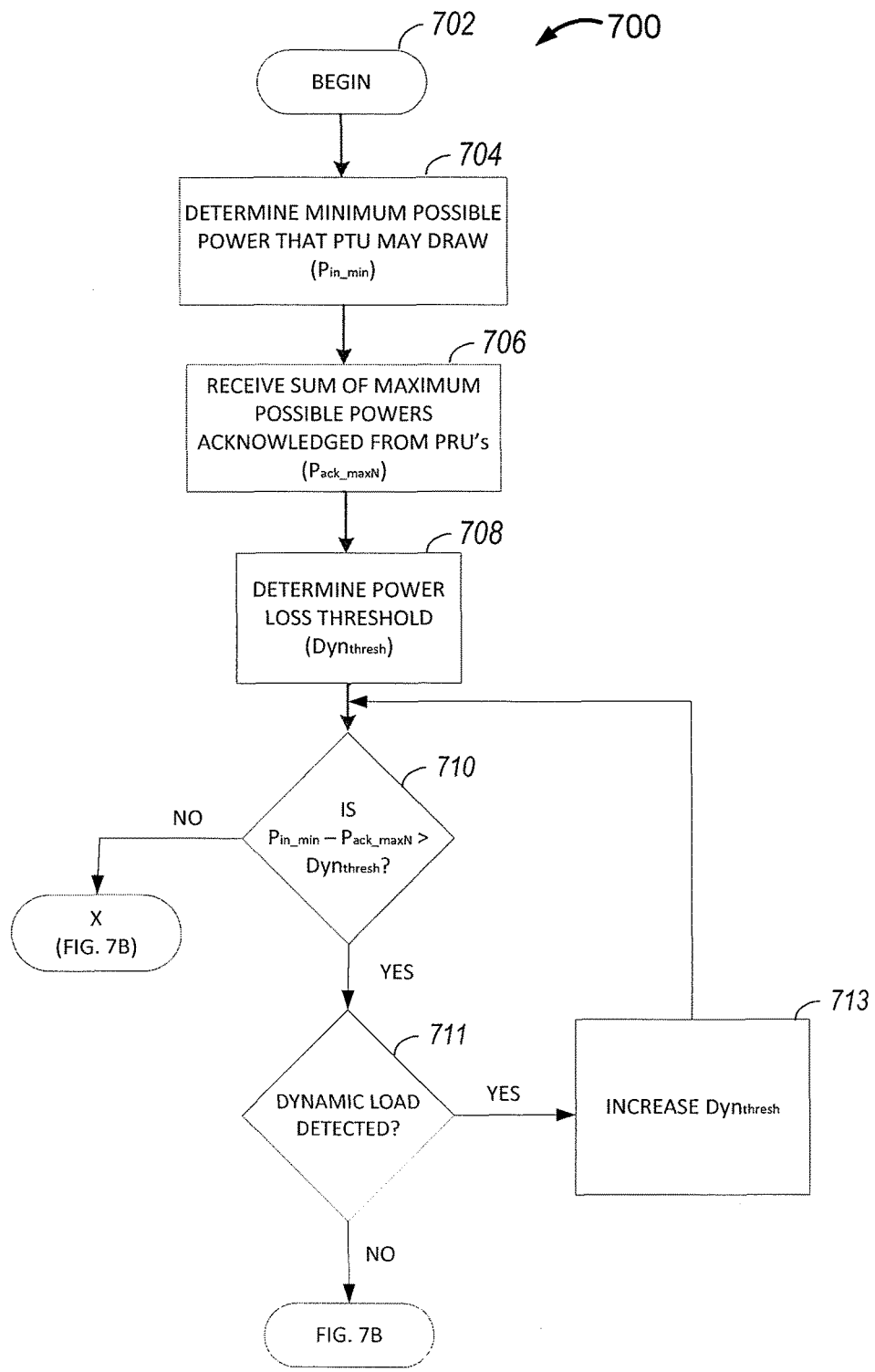
FIG. 7A and FIG. 7B illustrate a flowchart of an exemplary method for determining whether a non-compliant object is present within, near, or around a charging region.
Figure 7B:
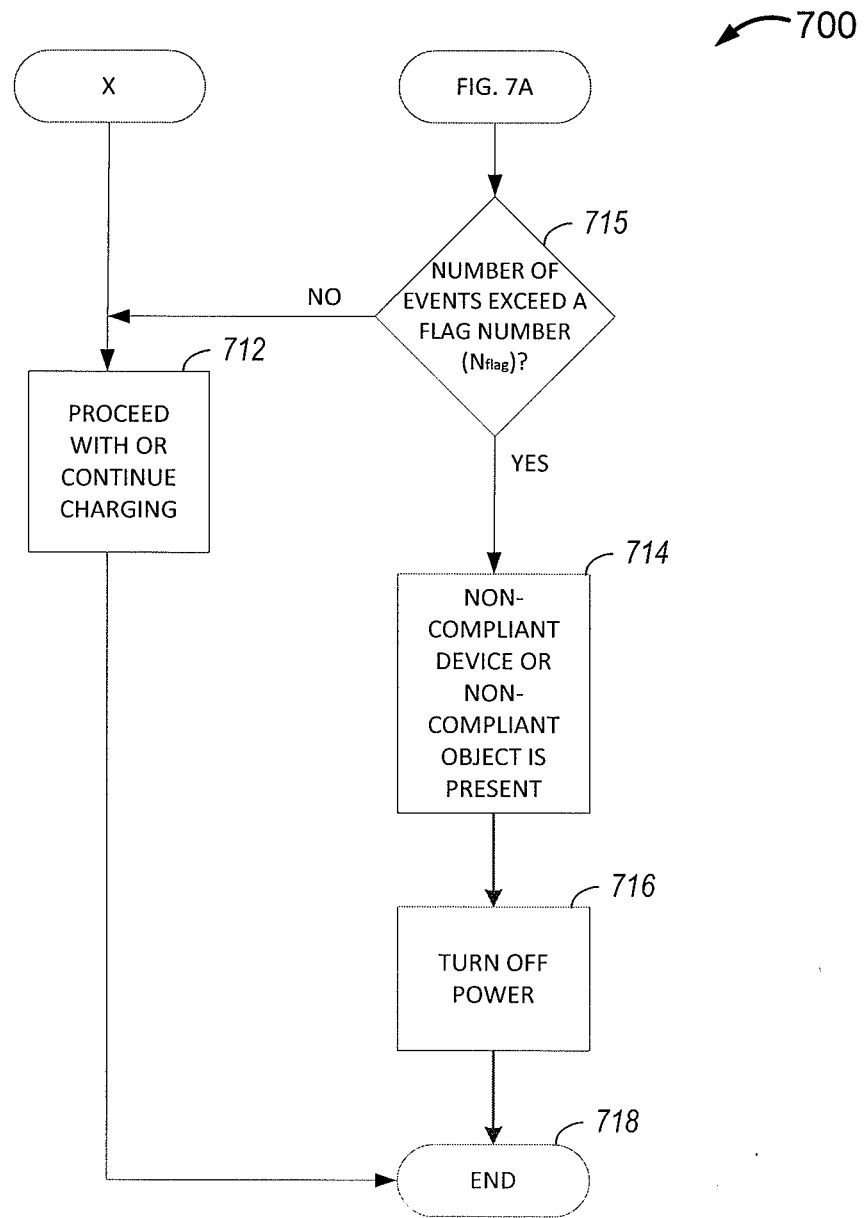

FIG. 7A and FIG. 7B illustrate a flowchart 700 of an exemplary method for the controller 515 (of FIG. 5) to determine whether a non-compliant object (e.g., the non-compliant object or the non-compliant device 486) is affecting the charging region (as described above in regards to FIG. 5). At block 702, the controller 515 begins the method when the PTU 504 is charging one or more PRUs (e.g., the PRUs 484). At block 704, the controller 515 determines the minimum possible power that the PTU 504 may be drawing from its power source (e.g., $P_{in\_min}$). In one embodiment, the controller 515 may obtain a first power measurement of a first power level of the PTU 504 (e.g., $P_{in}$) and then determine a first adjusted power measurement (e.g., $P_{in\_min}$) based on a tolerance value of at least one component of the PTU 504. At block 706, the controller 515 receives from the PRUs 484 the sum of the maximum possible powers that the transmit antenna 514 may acknowledge from the PRUs 484 (e.g., $P_{ack\_max_N}$). In one embodiment, the controller 515 may obtain a second power measurement of a second power level received by the PRU 484 (e.g., $P_{ack}$) and then determine a second adjusted power measurement (e.g., $P_{ack\_max}$) based on a tolerance value of at least one component of the PRU 484. In another embodiment, the controller 515 may determine a $P_{ack\_max}$ for each of the PRUs 484 and then determine $P_{ack_{max_N}}$ based on a sum of each $P_{ack\_max}$. At block 708, the controller 515 determines the power loss threshold parameter ($Dyn_{thresh}$). At block 710, the controller 515 determines whether the absolute value of the difference between $P_{in\_min}$ and $P_{ack\_max_N}$ is greater than $Dyn_{thresh}$. If it is, then at block 711, the controller determines whether a dynamic load is detected. If so, then at block 713, the controller 515 increases $Dyn_{thresh}$ and then returns to block 710. If, at block 711, the controller determined that a dynamic load was not detected, then at block 715, the controller 515 determines if the number of events has exceeded a flag number, $N_{flag}$ (e.g., some integer value). If not, then at block 712, the controller 515 proceeds with or continues instructing the PTU 504 to charge the PRU 484. If, at block 715, the controller determines that the number of events has exceeded $N_{flag}$, then at block 714, the controller 515 determines that the non-compliant object 486 is present. For example, the controller 515 may count the number of events that have exceeded $N_{flag}$. Then at block 716, the controller 515 turns off the power to the PTU 504. In another embodiment, rather than simply turning off at block 716, the PTU 504 may instead or additionally adjust the first power level and/or change a state of transmission of power from the PTU 504 to the PRU 484. If, at block 710, the absolute value of the difference between $P_{in\_min}$ and $P_{ack\_max_N}$ is not greater than $Dyn_{thresh}$, then at block 712, the controller 515 proceeds with or continues instructing the PTU 504 to charge the PRU 484. The method ends at block 718.

Figure 8:
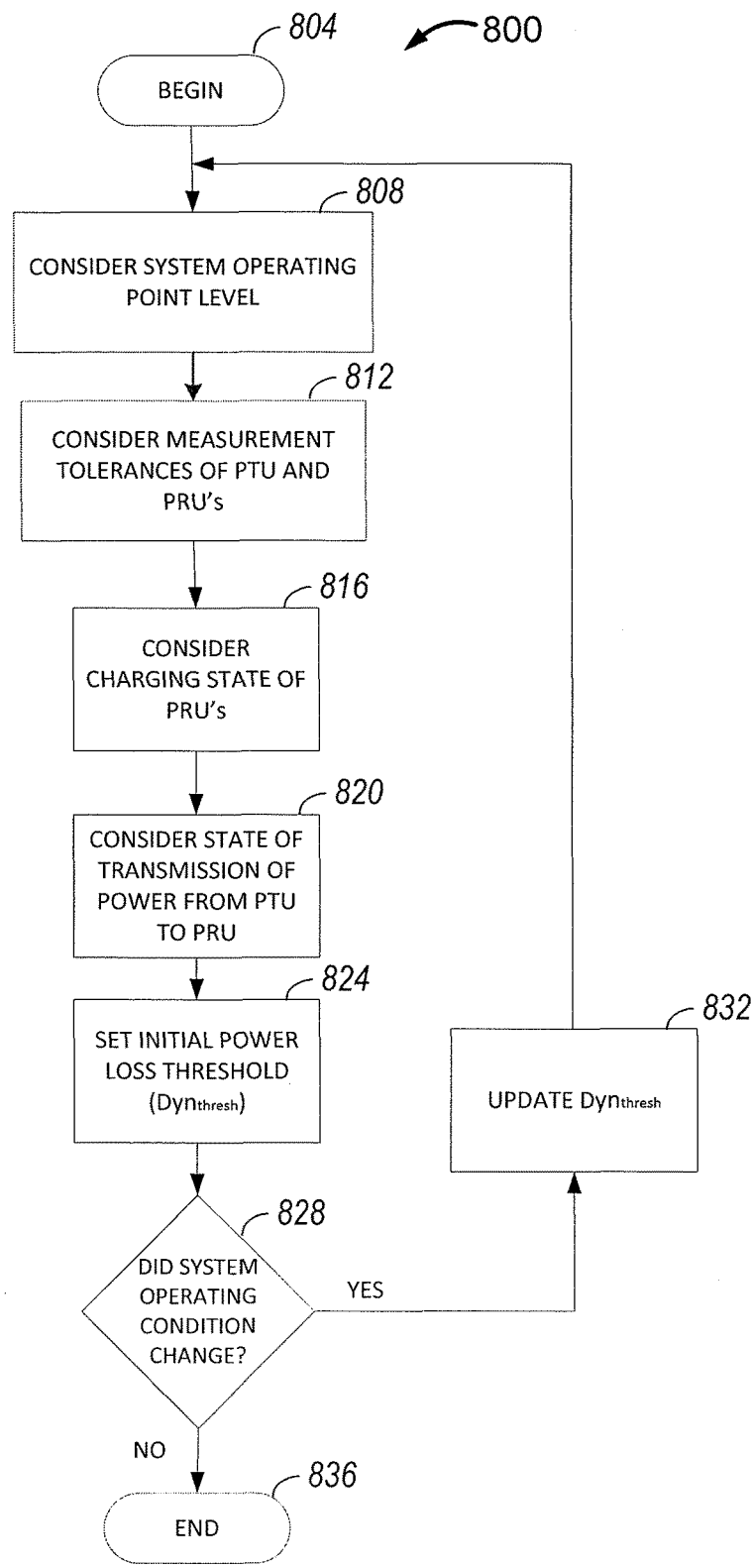
FIG. 8 is a flowchart of an exemplary process to set and vary a power loss threshold executed by the transmitter of FIG. 5.

FIG. 8 is a flowchart 800 of an exemplary process for the controller 515 (of FIG. 5) to set and vary a power loss threshold parameter ($Dyn_{thresh}$) executed by the transmitter of FIG. 5. At block 804, the controller 515 begins the process. The controller 515 will perform one or more of several checks in an effort to set the initial $Dyn_{thresh}$. The controller 515 may perform some or all of the checks. For example, at block 808, the controller 515 considers the system operating point level to determine the initial $Dyn_{thresh}$, as described in connection with FIG. 5. As another example, at block 812, the controller 515 considers the measurement tolerances of the PTU 504 and the one or more PRUs 484 to determine the initial $Dyn_{thresh}$, as described in connection with FIG. 5. As another example, at block 816, the controller 515 considers the charging state of the one or more PRUs 484 to determine the initial $Dyn_{thresh}$, as described in connection with FIG. 5. As another example, at block 820, the controller 515 considers the state of transmission of power from the PTU 504 to the one or more PRUs 484 to determine the initial $Dyn_{thresh}$, as described in connection with FIG. 5. Then at block 824, the controller 515 sets the initial $Dyn_{thresh}$, as described in connection with FIG. 5. At block 828, the controller 515 determines whether any of the system operating conditions described in connection with the above blocks 808, 812, 816, and 820 changed. If so, then the controller 515 updates $Dyn_{thresh}$ accordingly, as described in connection with FIG. 5, and then returns to the beginning of the process. If none of the system operating conditions changed, then in block 836, the process ends.

Figure 9:
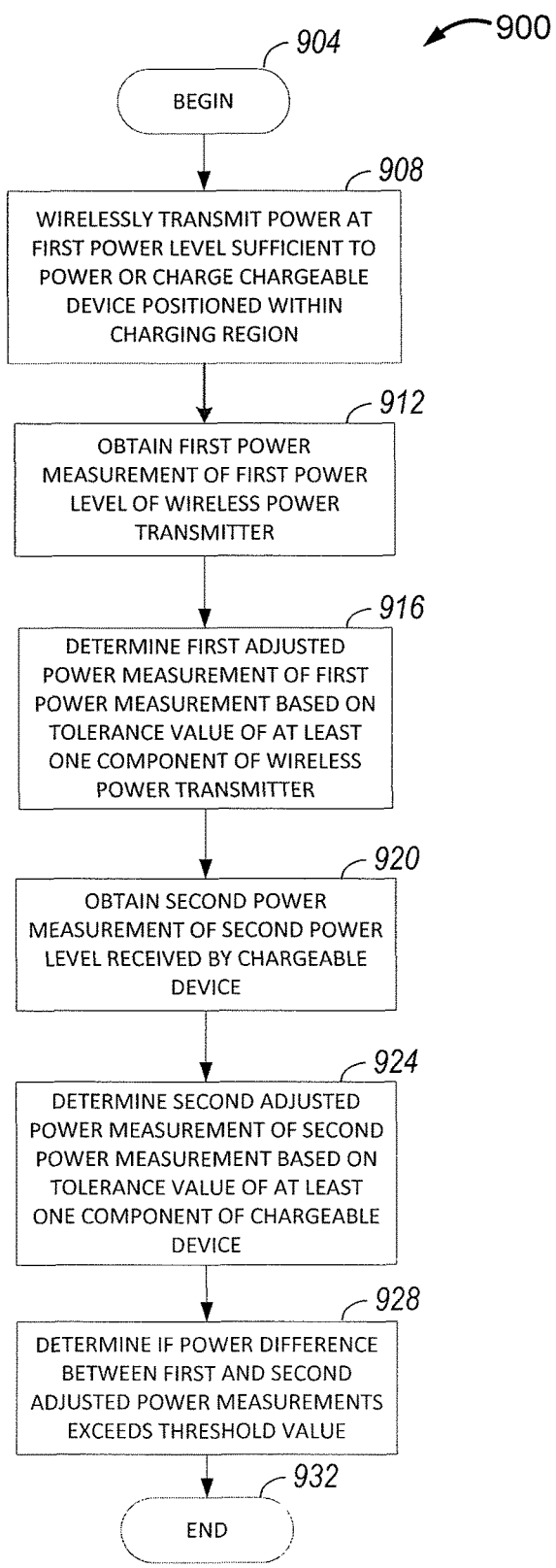
FIG. 9 is a flowchart of an exemplary method for wirelessly transferring power and determining if a power difference between first and second adjusted power measurements exceeds a threshold value.

FIG. 9 is a flowchart 900 of an exemplary method for wirelessly transferring power and determining if a power difference between first and second adjusted power measurements exceeds a threshold value. At block 904, the method begins. At block 908, the method comprises wirelessly transmitting power at a first power level sufficient to power or charge a chargeable device positioned within a charging region. At block 912, the method comprises obtaining a first power measurement of the first power level of the wireless power transmitter. At block 916, the method comprises determining a first adjusted power measurement of the first power measurement based on a tolerance value of at least one component of the wireless power transmitter. At block 920, the method comprises obtaining a second power measurement of a second power level received by the chargeable device. At block 924, the method comprises determining a second adjusted power measurement of the second power measurement based on a tolerance value of at least one component of the chargeable device. At block 928, the method comprises determining if a power difference between the first and second adjusted power measurements exceeds a threshold value. At block 932, the method ends.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations. For example, a means for selectively allowing current in response to a control voltage may comprise a first transistor. In addition, means for limiting an amount of the control voltage comprising means for selectively providing an open circuit may comprise a second transistor.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions may not be interpreted as causing a departure from the scope of the embodiments of the invention.

The various illustrative blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the processor such that the processor may read information from, and write information to, the storage medium. In the alternative, the storage medium may be integral to the processor. Disk and disc, as used herein, includes compact disc (CD), laser disc, optical disc, digital versatile disc (DVD), floppy disk and blu ray disc where disks usually reproduce data magnetically, while discs reproduce data optically with lasers. Combinations of the above may also be included within the scope of computer readable media. The processor and the storage medium may reside in an ASIC. The ASIC may reside in a user terminal. In the alternative, the processor and the storage medium may reside as discrete components in a user terminal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

Various modifications of the above described embodiments will be readily apparent, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus for wirelessly transferring power, the apparatus comprising:
   a wireless power transmitter configured to wirelessly transmit power at a level sufficient to power or charge a chargeable device positioned within a charging region; and
   a controller circuit operationally coupled to the wireless power transmitter and configured to:
      obtain a first power measurement indicating a level of power transmitted by the wireless power transmitter,
      determine a first adjusted power level by adjusting a value of the first power measurement based on a tolerance value of at least one component of the wireless power transmitter,
      obtain, from the chargeable device, a second power measurement indicating a level of power received by the chargeable device,
      determine a second adjusted power level by adjusting a value of the second power measurement based on a tolerance value of at least one component of the chargeable device, and
      determine if a power difference between the first and second adjusted power levels exceeds a threshold value.

2. The apparatus of claim 1, wherein the tolerance value of the at least one component of the wireless power transmitter and the tolerance value of the at least one component of the chargeable device are based on at least one of a measurement tolerance value, a unit-to-unit tolerance value, a coil resistance tolerance value, a voltage tolerance value, a current tolerance value, or a power dissipated tolerance value.

3. The apparatus of claim 1, wherein the tolerance value of the at least one component of the wireless power transmitter and the tolerance value of the at least one component of the chargeable device comprise a measurement difference range between a reported power measurement and an expected power measurement, wherein the measurement difference range comprises an upper tolerance percentage at which the reported power measurement exceeds the expected power measurement, and wherein the measurement difference range further comprises a lower tolerance percentage at which the reported power measurement is less than the expected power measurement.

4. The apparatus of claim 3, wherein the controller circuit is further configured to:
   determine the first adjusted power level based on the lower tolerance percentage of the tolerance value of each of the at least one component of the wireless power transmitter, and
   determine the second adjusted power level based on the upper tolerance percentage of the tolerance value of each of the at least one component of the chargeable device.

5. The apparatus of claim 1, wherein the threshold value is first set to be substantially equal to an initial power difference obtained from a theoretical, a simulated, or an experimental measurement of the power difference between respective levels of power obtained or measured at the wireless power transmitter and the chargeable device.

6. The apparatus of claim 1, wherein the controller circuit is further configured to adjust the threshold value based at least in part on one or more operating conditions, the one or more operating conditions comprising at least one of a presence of a dynamic load in the chargeable device, a system operating point that changes its output power, a charging state of the chargeable device, the tolerance value of the at least one component of the wireless power transmitter, the tolerance value of the at least one component of the chargeable device, the level of power indicated by the first power measurement, an amount of variation of the second power measurement being above a predetermined variation threshold, a frequency at which a load of the chargeable device changes being above a predetermined maximum frequency threshold, or a state of transmission of power from the wireless power transmitter to the chargeable device.

7. The apparatus of claim 1, wherein the controller circuit is further configured to:
set the threshold value to a first threshold value when the chargeable device is being charged, and
set the threshold value to a second threshold value when the chargeable device is not being charged, wherein the first threshold value is greater than the second threshold value.

8. The apparatus of claim 1, wherein the controller circuit is further configured to:
determine if the level of power indicated by first power measurement or the second power measurement is equal to X or Y, where X is greater than Y,
set the threshold value to a first threshold value if the first power level or the second power level is equal to X, and
set the threshold value to a second threshold value if the first power level or the second power level is equal to Y, wherein the first threshold value is greater than the second threshold value.

9. The apparatus of claim 1, wherein the power difference is determined by subtracting the second adjusted power level from the first adjusted power level.

10. The apparatus of claim 1, wherein the controller circuit is further configured to detect the presence of a non-compliant object that affects consumption of power transmitted by the wireless power transmitter if the power difference exceeds the threshold value.

11. The apparatus of claim 10, wherein the controller circuit is further configured to:
count the number of times, N, that the power difference exceeds the threshold value, wherein N is an integer greater than 1, and
determine that the non-compliant object is present if N exceeds a maximum count value.

12. The apparatus of claim 11, wherein the wireless power transmitter turns off, adjusts a level of power transmitted, and/or changes a state of transmission of power from the wireless power transmitter to the chargeable device if the controller circuit determines that the non-compliant object is present, the non-compliant object comprising at least one of a damaged device, a device not in compliance with a charging standard, an object or device unable to communicate with the wireless power transmitter, or a metal object that couples to a magnetic field of the wireless power transmitter.

13. A method for wirelessly transferring power, the method comprising:
wirelessly transmitting power at a level sufficient to power or charge a chargeable device positioned within a charging region;
obtaining a first power measurement indicating a level of power transmitted by the wireless power transmitter;
determining a first adjusted power level by adjusting a value of the first power measurement based on a tolerance value of at least one component of the wireless power transmitter;
obtaining, from the chargeable device, a second power measurement of indicating a level of power received by the chargeable device;
determining a second adjusted power level by adjusting a value of the second power measurement based on a tolerance value of at least one component of the chargeable device, and
determining if a power difference between the first and second adjusted power levels exceeds a threshold value.

14. The method of claim 13, wherein the tolerance value of the at least one component of the wireless power transmitter and the tolerance value of the at least one component of the chargeable device are based on at least one of a measurement tolerance value, a unit-to-unit tolerance value, a coil resistance tolerance value, a voltage tolerance value, a current tolerance value, or a power dissipated tolerance value.

15. The method of claim 13, wherein the tolerance value of each of the at least one component of the wireless power transmitter and the tolerance value of each of the at least one component of the chargeable device comprising a measurement difference range between a reported power measurement and an expected power measurement, wherein the measurement difference range comprises an upper tolerance percentage at which the reported power measurement exceeds the expected power measurement, and wherein the measurement difference range further comprises a lower tolerance percentage at which the reported power measurement is less than the expected power measurement.

16. The method of claim 15, further comprising:
determining the first adjusted power level based on the lower tolerance percentage of the tolerance value of each of the at least one component of the wireless power transmitter, and
determining the second adjusted power level based on the upper tolerance percentage of the tolerance value of each of the at least one component of the chargeable device.

17. The method of claim 13, further comprising adjusting the threshold value based at least in part on one or more operating conditions, the one or more operating conditions comprising at least one of a presence of a dynamic load in the chargeable device, a system operating point that changes its output power, a charging state of the chargeable device, the tolerance value of the at least one component of the wireless power transmitter, the tolerance value of the at least one component of the chargeable device, the level of power indicated by first power measurement, an amount of variation of the second power measurement being above a predetermined variation threshold, a frequency at which a load of the chargeable device changes being above a predetermined maximum frequency threshold, and a state of transmission of power from the wireless power transmitter to the chargeable device.

18. The method of claim 13, further comprising detecting the presence of a non-compliant object that affects consumption of power transmitted by the wireless power transmitter if the power difference exceeds the threshold value.

19. An apparatus for wirelessly transferring power, the apparatus comprising:

means for wirelessly transmitting power at a level sufficient to power or charge a chargeable device positioned within a charging region;

means for obtaining a first power measurement indicating a level of power transmitted by the wireless power transmitter;

means for determining a first adjusted power level by adjusting a value of the first power measurement based on a tolerance value of at least one component of the wireless power transmitter;

means for obtaining, from the chargeable device, a second power measurement indicating a level of power received by the chargeable device;

means for determining a second adjusted power level by adjusting a value of the second power measurement based on a tolerance value of at least one component of the chargeable device, and means for determining if a power difference between the first and second adjusted power levels exceeds a threshold value.

20. The apparatus of claim 19, further comprising means for detecting the presence of a non-compliant object that affects consumption of power transmitted by the wireless power transmitter if the power difference exceeds the threshold value.

* * * * *